US008696969B2

(12) United States Patent
Wuister et al.

(10) Patent No.: US 8,696,969 B2
(45) Date of Patent: Apr. 15, 2014

(54) IMPRINT LITHOGRAPHY METHOD AND APPARATUS

(75) Inventors: Sander Frederik Wuister, Eindhoven (NL); Johan Frederik Dijksman, Weert (NL); Yvonne Wendela Kruijt-Stegeman, Eindhoven (NL); Jeroen Herman Lammers, Eindhoven (NL); Leendert Van Der Tempel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 218 days.

(21) Appl. No.: 12/698,368

(22) Filed: Feb. 2, 2010

(65) Prior Publication Data

US 2010/0193994 A1 Aug. 5, 2010

Related U.S. Application Data

(60) Provisional application No. 61/149,869, filed on Feb. 4, 2009.

(51) Int. Cl.
*B29C 59/02* (2006.01)
(52) U.S. Cl.
USPC .................. 264/293; 264/319; 425/385
(58) Field of Classification Search
CPC ................ B82Y 10/00; B29C 59/02
USPC ................ 264/293, 319; 425/385
See application file for complete search history.

(56) References Cited

U.S. PATENT DOCUMENTS

| 6,334,960 | B1 | 1/2002 | Willson et al. |
| 7,360,851 | B1 | 4/2008 | Snyder |
| 7,676,088 | B2 | 3/2010 | Simon |
| 8,142,703 | B2 * | 3/2012 | Xu et al. ............ 264/293 |
| 2004/0124566 | A1 | 7/2004 | Sreenivasan et al. |
| 2006/0137555 | A1 | 6/2006 | Simon |
| 2007/0138699 | A1 | 6/2007 | Wuister et al. |

(Continued)

FOREIGN PATENT DOCUMENTS

| CN | 1987645 | 6/2007 |
| JP | 2003-080130 | 3/2003 |

(Continued)

OTHER PUBLICATIONS

Korean Office Action dated Apr. 27, 2011 in corresponding Korean Patent Application No. 10-2010-0010162.

(Continued)

*Primary Examiner* — James Sanders
(74) *Attorney, Agent, or Firm* — Pillsbury Winthrop Shaw Pittman LLP

(57) ABSTRACT

An imprint lithography method is provided. The method includes undertaking first and second imprints, which comprises for each imprint: for an area of a substrate provided with a plurality of drops of imprintable medium in respectively first and second configurations, imprinting a pattern in the imprintable medium using a same imprint template, pockets being formed between the drops of the imprintable medium, the imprint template and the substrate during the imprinting of the pattern, wherein the first configuration of drops of imprintable medium is different from the second configuration of drops of imprintable medium, such that pockets formed during the second imprint are formed at different locations relative to the imprint template to pockets formed during the first imprint.

20 Claims, 5 Drawing Sheets

(56) References Cited

U.S. PATENT DOCUMENTS

| | | | |
|---|---|---|---|
| 2007/0141271 A1* | 6/2007 | Xu et al. | 427/508 |
| 2007/0228589 A1* | 10/2007 | Choi et al. | 264/39 |
| 2007/0237886 A1 | 10/2007 | Dijksman et al. | |
| 2008/0018875 A1 | 1/2008 | Schram et al. | |
| 2008/0023880 A1 | 1/2008 | Imada et al. | |
| 2009/0014917 A1* | 1/2009 | Hodge et al. | 264/401 |

FOREIGN PATENT DOCUMENTS

| | | |
|---|---|---|
| JP | 2005-000721 | 1/2005 |
| JP | 2007-502715 | 2/2007 |
| JP | 2007-516862 | 6/2007 |
| JP | 2007-273979 | 10/2007 |
| JP | 2007-320098 | 12/2007 |
| JP | 2008-502157 | 1/2008 |
| JP | 2008-034412 | 2/2008 |
| JP | 2008-042187 | 2/2008 |
| JP | 2008-509815 | 4/2008 |
| JP | 2009-043998 | 2/2009 |
| JP | 2009-088376 | 4/2009 |
| JP | 2009-177146 | 8/2009 |
| JP | 2010-530641 | 9/2010 |
| TW | I295227 | 4/2008 |
| TW | I304520 | 12/2008 |
| WO | 02/067055 A2 | 8/2002 |
| WO | 2005/047975 | 5/2005 |
| WO | 2005/120834 | 12/2005 |
| WO | 2006/023297 | 3/2006 |
| WO | 2008/156750 | 12/2008 |

OTHER PUBLICATIONS

J. Haisma et al., "Mold-assisted nanolithography: A process for reliable pattern replication," J. Vac. Sci. Technol. B 14 (6), Nov./Dec. 1996, pp. 4124-4128.

Japanese Office Action dated Jan. 18, 2012 in corresponding Japanese Patent Application No. 2010-016186.

Taiwan Office Action dated Nov. 6, 2012 in corresponding Taiwan Patent Application No. 098143713.

* cited by examiner

IMPRINT LITHOGRAPHY METHOD AND APPARATUS

This application claims priority and benefit under 35 U.S.C. §119(e) to U.S. Provisional Patent Application No. 61/149,869, entitled "Imprint Lithography Method and Apparatus", filed on Feb. 4, 2009. The content of that application is incorporated herein in its entirety by reference.

FIELD

The present invention relates to an imprint lithography method and apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve pressing together a patterned surface of an imprint template and a layer of imprintable medium such that the imprintable medium flows into recesses in the patterned surface and is pushed aside by protrusions on the patterned surface. The recesses define pattern features of the patterned surface of the imprint template. Typically, the imprintable medium is flowable as the patterned surface and the imprintable medium are pressed together. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate. The imprintable medium is typically formed from imprintable medium drops on the surface of a substrate to be patterned.

SUMMARY

During the imprint process, gas may become trapped in pockets formed between the imprintable medium, imprint template and substrate. A highly diffusive gas, such as helium, may be used as an atmosphere in which imprinting takes place. Any trapped gas pockets may then be dissolved more rapidly into the imprintable medium, the substrate or the imprint template.

A problem that may arise from this approach is that diffusion and/or dissolution of gas is a relatively slow process, even when a gas such as helium is used. This may lead to the need to hold the imprint template and the imprintable medium pressed together for several seconds, tens of seconds or even minutes in order to reduce gas pocket distortions to the patterning. This, in turn, may lead to reduction in throughput for imprint lithography processes, as the diffusion time may be the rate-determining step preventing early separation of the imprint template and patterned imprintable medium.

Gas in the gas pockets will diffuse, for example, into the substrate and/or imprint template (predominantly the imprint template). In the region of this diffusion in the substrate and/or imprint template, the concentration of the gas will be higher than in surrounding regions. In a subsequent imprint, gas pockets formed at the location of previously formed gas pockets relative to the imprint template (and/or substrate) will take longer to diffuse into the substrate and/or imprint template. This is because the regions of the substrate and/or imprint template into or through which the gas would diffuse already contains gas which has diffused into those regions from gas pockets formed in a previous imprint. Thus, this longer diffusion time may lead to the need to hold the imprint template and the imprintable medium pressed together for an increased period of time.

In imprint lithography, a surfactant may be added to the imprintable medium and/or the imprint template to reduce the forces on the imprintable medium and/or the imprint template when the imprint template is released from the imprintable medium. In the region of gas pockets formed in the imprintable medium during the imprint process, the surfactant concentration is reduced. Because the surfactant concentration is reduced, the release forces on the imprint template and/or imprintable medium in the region of the reduction in concentration (i.e. the location of the gas pockets) are increased. Such an increase in release forces can lead to damage of, for example, a release layer provided on the imprint template, or to defects in a pattern formed in the imprintable medium.

In some applications, surfactant depletion may be more of a problem than the reduction in the rate of diffusion trapped in gas pockets.

Accordingly, it is desirable, for example, to provide an imprint lithography method and/or apparatus that obviates or mitigates at least one of the problems disclosed herein, or of the prior art in general.

According to an aspect, there is provided an imprint lithography method comprising: undertaking a first imprint, which comprises: for an area of a substrate provided with a plurality of drops of imprintable medium in a first configuration, imprinting a pattern in the imprintable medium using an imprint template, pockets being formed between the drops of the imprintable medium, the imprint template and the substrate during the imprinting of the pattern; and undertaking a second imprint, which comprises: for an area of a substrate provided with a plurality of drops of imprintable medium in a second configuration, imprinting a pattern in the imprintable medium using the same imprint template, pockets being formed between the drops of the imprintable medium, the imprint template and the substrate during the imprinting of the pattern; wherein the first configuration of drops of imprintable medium is different from the second configuration of drops of imprintable medium, such that pockets formed during the second imprint are formed at different locations relative to the imprint template to pockets formed during the first imprint.

The method may comprise, before imprinting a pattern in the imprintable medium, controlling an imprintable medium dispenser with first control instructions to provide the drops in the first configuration, and controlling an imprintable medium dispenser with second control instructions to provide the drops in the second configuration, the first and second control instructions being different.

The area of the substrate for the first and second imprints may be the same. Alternatively, the area of the substrate for the first imprint (i.e. a first area) may be different to the area of the substrate for the second imprint (i.e. a second area). In general, it is most likely that the area of the substrate for the first imprint (i.e. the first area) will be different to the area of the substrate for the second imprint (i.e. the second area).

The first configuration may be different from the second configuration, such that a majority of pockets formed during the second imprint are formed at different locations relative to the imprint template to pockets formed during the first imprint.

The first configuration may be different from the second configuration, such that all pockets formed during the second imprint are formed at different locations relative to the imprint template to pockets formed during the first imprint.

The method may further comprise undertaking a further imprint, the configuration of the drops of imprintable medium being changed for the further imprint such that pockets formed during the further imprint are formed at different locations relative to the imprint template to pockets formed during a previous imprint. After undertaking the first, second and further imprints, the method may comprise undertaking an additional imprint where the drops of imprintable medium have the substantially same configuration as was used in the first imprint.

For the first and/or second imprint, the imprint template may be imprinted into the imprintable medium in such a way that the imprint template is not parallel to the substrate when the imprint template initially contacts with the substrate, but instead lies at an angle to the substrate. This is known as 'imprinting under an angle'.

The second configuration of drops of imprintable medium may have the substantially same pattern as the first configuration of drops of imprintable medium, the second configuration being different from the first configuration in that the pattern is shifted in a plane substantially parallel to the surface of the substrate.

The second configuration of drops of imprintable medium may be different from the first configuration of drops of imprintable medium in that one or more drops of the second configuration have a different position, size, shape or volume in comparison with one or more drops of the first configuration.

The second configuration of drops of imprintable medium may be different from the first configuration of drops of imprintable medium in that the second configuration has a different pattern in comparison with the first configuration. The pattern may be changed by changing the pitch of the drops.

The second configuration of drops of imprintable medium may be different from the first configuration of drops of imprintable medium in that the second configuration comprises greater or fewer drops in comparison with the first configuration.

The total volume of all drops of imprintable medium may be substantially equal for the first configuration and second configuration.

The volume of each drop of imprintable medium may be in the range of 1 pl to 100 pl, or 1 pl to 20 pl.

The imprint lithography method may be undertaken in a gaseous atmosphere, such that the pockets contain or comprise gas. The gaseous atmosphere may comprise helium, such that the pockets contain or comprise helium.

A release layer may be provided on the imprint template.

A surfactant may be provided on the imprint template, and/or in or on the imprintable medium.

The first and second imprints may be undertaken in parallel and/or substantially simultaneously (i.e. the intention being to undertake the first and second imprint at the same time).

The method may comprise: providing the plurality of drops of imprintable medium in the first configuration on an area of the substrate before the first and/or second imprint is undertaken, and/or providing the plurality of drops of imprintable medium in the second configuration on an area of the substrate before the first and/or second imprint is undertaken.

The imprint template may be made from or comprise quartz.

According to an aspect, there is provided an imprint lithography apparatus comprising: a substrate holder to hold a substrate; an imprintable medium dispenser to dispense drops of imprintable medium onto the substrate; a control arrangement to control one or both of the substrate holder and the imprintable medium dispenser to ensure that drops of imprintable medium are provided on a surface of the substrate in a specific configuration; and an imprint template holder configured to hold an imprint template to imprint a pattern into the imprintable medium, wherein, for a first imprint, the control arrangement is configured to ensure that a plurality of drops of imprintable medium are provided on an area of the substrate, the plurality of drops of imprintable medium having a first configuration, and for a second imprint, the control arrangement is configured to ensure that a plurality of drops of imprintable medium are provided on an area of the substrate, the plurality of drops of imprintable medium having a second configuration, and the control arrangement is configured to ensure that the first configuration of drops of imprintable medium is different from the second configuration of drops of imprintable medium, such that pockets formed between the imprint template, the drops of imprintable medium and the substrate during the second imprint are formed at different locations relative to the imprint template to pockets formed between the imprint template and the drops of imprintable medium during the first imprint.

The control arrangement (controller) of the imprintable medium dispenser may provide to the imprintable medium dispenser, or be arranged to receive (e.g. be provided with), with first control instructions to provide the drops in the first configuration, and the controller of the imprintable medium dispenser may provide to the imprintable medium dispenser, or be arranged to receive (e.g. be provided with) second control instructions to provide the drops in the second configuration, the first and second control instructions being different.

The area of the substrate for the first and second imprints may be the same. Alternatively, the area of the substrate for the first imprint (i.e. a first area) may be different to the area of the substrate for the second imprint (i.e. a second area). In general, it is most likely that the area of the substrate for the first imprint (i.e. the first area) will be different to the area of the substrate for the second imprint (i.e. the second area).

The first configuration may be different from the second configuration, such that a majority of pockets formed during the second imprint are formed at different locations relative to the imprint template to pockets formed during the first imprint.

The first configuration may be different from the second configuration, such that all pockets formed during the second imprint are formed at different locations relative to the imprint template to pockets formed during the first imprint.

A further imprint may be undertaken, the control arrangement being configured to ensure that the configuration of the drops of imprintable medium is changed for the further imprint such that pockets formed during the further imprint are formed at different locations relative to the imprint template to pockets formed during a previous imprint. After undertaking the first, second and further imprints, an additional imprint may be undertaken. In the additional imprint, the control arrangement may be configured to ensure that the drops of imprintable medium have the substantially same configuration as was used in the first imprint.

For the first and/or second imprint, the imprint template may be imprinted into the imprintable medium in such a way that the imprint template is not parallel to the substrate when the imprint template initially comes into contact with the substrate, but instead lies at an angle to the substrate. The control arrangement may be configured to ensure that such an angle initially exists between the imprint template and the substrate, and/or the control arrangement may be configured to control the magnitude of the angle. This may be achieved by controlling the position and/or orientation of the substrate and/or imprint template, for example by appropriate control of a substrate holder that is holding the substrate, and/or the imprint template holder that is holding the imprint template.

The second configuration of drops of imprintable medium may have the substantially same pattern as the first configuration of drops of imprintable medium, the second configuration being different from the first configuration in that the pattern is shifted in a plane substantially parallel to the surface of the substrate.

The second configuration of drops of imprintable medium may be different from the first configuration of drops of imprintable medium in that one or more drops of the second configuration have a different position, size, shape or volume in comparison with one or more drops of the first configuration.

The second configuration of drops of imprintable medium may be different from the first configuration of drops of imprintable medium in that the second configuration has a different pattern in comparison with the first configuration.

The second configuration of drops of imprintable medium may be different from the first configuration of drops of imprintable medium in that the second configuration comprises greater or fewer drops in comparison with the first configuration.

The total volume of all drops of imprintable medium may be substantially equal for the first configuration and the second configuration.

The volume of each drop of imprintable medium may be in the range of 1 pl to 100 pl, or 1 pl to 20 pl.

The imprints may be undertaken in a gaseous atmosphere, such that the pockets contain or comprise gas. The gaseous atmosphere may comprise helium, such that the pockets contain or comprise helium.

A release layer may be provided on the imprint template.

A surfactant may be provided on the imprint template, and/or in or on the imprintable medium.

The first and second imprints may be undertaken in parallel and/or substantially simultaneously, for example by using two imprint templates controlled to be imprinted into respective areas of imprintable medium at the same time, or by providing one or more imprint templates that are in some way physically connected to ensure that the first and second imprints may be undertaken in parallel and/or substantially simultaneously.

The plurality of drops of imprintable medium in the first configuration may be provided on an area of the substrate before the first and/or second imprint is undertaken, and/or the plurality of drops of imprintable medium in the second configuration may be provided on an area of the substrate before the first and/or second imprint is undertaken.

The imprint template may be made from or comprise quartz.

According to an aspect, there is provided an imprint lithography method comprising: controlling an imprintable medium dispenser with first control instructions to provide a plurality of drops of imprintable medium in a first configuration; undertaking a first imprint, which comprises: for an area of a substrate provided with the drops in the first configuration, imprinting a pattern in the imprintable medium using an imprint template, pockets being formed between the drops of the imprintable medium, the imprint template and the substrate during the imprinting of the pattern; controlling an imprintable medium dispenser with second control instructions to provide a plurality of drops of imprintable medium in a second configuration, the first and second control instructions being different; and undertaking a second imprint, which comprises: for an area of a substrate provided with the drops in the second configuration, imprinting a pattern in the imprintable medium using the same imprint template, pockets being formed between the drops of the imprintable medium, the imprint template and the substrate during the imprinting of the pattern, wherein the first configuration of drops of imprintable medium is different from the second configuration of drops of imprintable medium, such that pockets formed during the second imprint are formed at different locations relative to the imprint template to pockets formed during the first imprint.

According to an aspect, there is provided an imprint lithography apparatus comprising: a substrate holder to hold a substrate; an imprintable medium dispenser to dispense drops of imprintable medium onto the substrate; a control arrangement to control one or both of the substrate holder and the imprintable medium dispenser to ensure that drops of imprintable medium are provided on a surface of the substrate in a specific configuration; and an imprint template holder configured to hold an imprint template to imprint a pattern into the imprintable medium, wherein for a first imprint, the control arrangement is configured to provide to the imprint medium dispenser, or be arranged to receive, first instructions that are configured to ensure that a plurality of drops of imprintable medium are provided on an area of the substrate, the plurality of drops of imprintable medium having a first configuration; and for a second imprint, the control arrangement is configured to provide to the imprint medium dispenser, or be arranged to receive, second instructions that are configured to ensure that a plurality of drops of imprintable medium are provided on an area of the substrate, the plurality of drops of imprintable medium having a second configuration, wherein the instructions and/or the control arrangement is configured to ensure that the first configuration of drops of imprintable medium is different from the second configuration of drops of imprintable medium, such that pockets formed between the imprint template, the drops of imprintable medium and the substrate during the second imprint are formed at different locations relative to the imprint template to pockets formed between the imprint template, the drops of imprintable medium and the substrate during the first imprint.

According to an aspect, there is provided an imprint lithography method comprising: undertaking a first imprint, which comprises: for an area of a substrate provided with a plurality of drops of imprintable medium in a first configuration, imprinting a pattern in the imprintable medium using an imprint template; and undertaking a second imprint, which comprises: for an area of a substrate provided with a plurality of drops of imprintable medium in a second configuration, imprinting a pattern in the imprintable medium using the same imprint template, wherein the first configuration of drops of imprintable medium is different from the second configuration of drops of imprintable medium.

According to an aspect, there is provided an imprint lithography apparatus comprising: a substrate holder to hold a substrate; an imprintable medium dispenser to dispense drops of imprintable medium onto the substrate; a control arrangement to control one or both of the substrate holder and the imprintable medium dispenser to ensure that drops of imprintable medium are provided on a surface of the substrate in a specific configuration; and an imprint template holder configured to hold an imprint template to imprint a pattern into the imprintable medium, wherein for a first imprint, the control arrangement is configured to ensure that a plurality of drops of imprintable medium are provided on an area of the substrate, the plurality of drops of imprintable medium having a first configuration, and for a second imprint, the control arrangement is configured to ensure that a plurality of drops of imprintable medium are provided on an area of the substrate, the plurality of drops of imprintable medium having a second configuration, and the control arrangement is configured to ensure that the first configuration of drops of imprintable medium is different from the second configuration of drops of imprintable medium.

According to an aspect, there is provided an imprint lithography method comprising: controlling an imprintable medium dispenser with first control instructions to provide a plurality of drops of imprintable medium in a first configuration; undertaking a first imprint, which comprises: for an area of a substrate provided with the drops in the first configuration, imprinting a pattern in the imprintable medium using an imprint template; controlling an imprintable medium dispenser with second control instructions to provide a plurality of drops of imprintable medium in a second configuration, the first and second control instructions being different; and undertaking a second imprint, which comprises: for an area of a substrate provided with the drops in the second configuration, imprinting a pattern in the imprintable medium using the same imprint template, wherein the first configuration of drops of imprintable medium is different from the second configuration of drops of imprintable medium.

According to an aspect, there is provided an imprint lithography apparatus comprising: a substrate holder to hold a substrate; an imprintable medium dispenser to dispense drops of imprintable medium onto the substrate; a control arrangement to control one or both of the substrate holder and the imprintable medium dispenser to ensure that drops of imprintable medium are provided on a surface of the substrate in a specific configuration; and an imprint template holder configured to hold an imprint template to imprint a pattern into the imprintable medium, wherein for a first imprint, the control arrangement is configured to provide to the imprintable medium dispenser, or be arranged to receive, first instructions that are configured to ensure that a plurality of drops of imprintable medium are provided on an area of the substrate, the plurality of drops of imprintable medium having a first configuration, for a second imprint, the control arrangement is configured to provide to the imprintable medium dispenser, or be arranged to receive, second instructions that are configured to ensure that a plurality of drops of imprintable medium are provided on an area of the substrate, the plurality of drops of imprintable medium having a second configuration, and the instructions and/or the control arrangement is configured to ensure that the first configuration of drops of imprintable medium is different from the second configuration of drops of imprintable medium.

According to an aspect, there is provided an imprint method comprising forming a first pattern of imprintable medium on a substrate and a second pattern of imprintable medium on a substrate, the first and second patterns being different, and imprinting the first and second patterns with the same template.

According to an aspect, there is provided an imprint method comprising instructing an imprintable medium dispenser to form a first pattern of imprintable medium on a substrate and a second pattern of imprintable medium on a substrate, wherein instructions to the imprintable medium dispenser to form the first pattern and the second pattern are different, and imprinting the first and second patterns with the same template.

Where applicable, each of the aspects of the present invention may have one or more features described in relation to any of the other aspects of the present invention.

BRIEF DESCRIPTION OF THE DRAWINGS

Specific embodiments of the invention will be described with reference to the accompanying Figures, in which:

FIG. 2b schematically depicts an arrangement to dispose imprintable medium onto one or more areas of the substrate shown in and described with reference to FIG. 2a;

DETAILED DESCRIPTION

Figure 1:
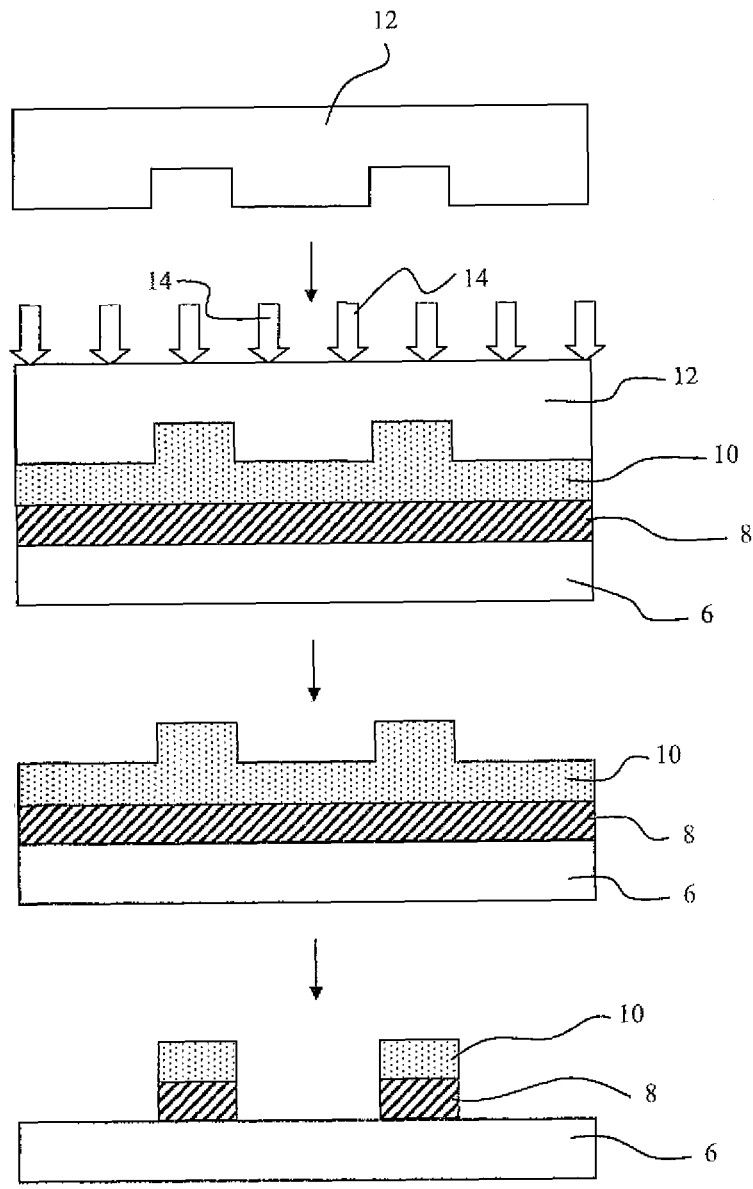
FIG. 1 schematically depicts an example of UV imprint lithography.

An example of a known approach to imprint lithography is schematically depicted in FIG. 1.

FIG. 1 shows an example of ultraviolet (UV) imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than the thermosetting and thermoplastic resin used in hot imprint lithography and consequently may move much faster to fill template pattern features.

A substrate 6 is provided with a planarization and transfer layer 8. UV-curable resin 10 as an imprintable medium is provided on the planarization and transfer layer 8. A quartz template 12 is contacted (e.g., imprinted into) to the UV-curable resin 10. A pattern formed by pattern features of the quartz template 12 is "frozen" by curing the UV-curable resin 12 with UV radiation 14 that is applied through the quartz template 12 onto the UV-curable resin 10. After disconnection between the template 12 and the UV-curable resin 10, the UV-curable resin 10 is etched such that thinner areas of the UV-curable resin 10 are etched down to the substrate. A particular manner of patterning a substrate through UV imprint lithography is so-called step and flash imprint lithography (SFIL), which may be used to pattern a substrate in small steps in a similar manner to optical steppers conventionally used in integrated circuit (IC) manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Figure 2A:
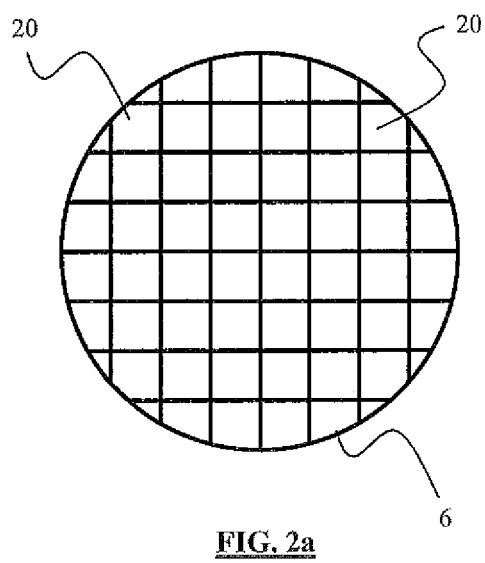
FIG. 2a schematically depicts a substrate divided into a plurality of areas in which one or more patterns are to be provided using imprint lithography.

FIG. 2a schematically depicts a plan view of a substrate 6 (e.g. the substrate shown in and described with reference to FIG. 1). The substrate 6 has been divided into a plurality of areas 20. The areas 20 may be or correspond to individual dies, or alternatively or additionally could correspond to areas that may be imprinted at any one given time, for example in a step and repeat imprint lithography process. Although FIG. 2a shows that the areas 20 are defined by a number of intersecting lines, the lines are given by way of example only to highlight the different areas 20. In practice, no such lines may exist on the substrate 6. The substrate 6 may be held by a substrate holder (not shown), and the substrate holder may be moveable to move the substrate 6.

Figure 2B:
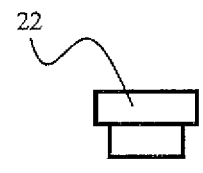

FIG. 2b shows an imprintable medium dispenser 22. The imprintable medium dispenser 22 may be used to provide imprintable medium on one or more areas of the substrate shown in and described with reference to FIG. 2a. The substrate and/or imprintable medium dispenser 22 may be moved relative to one another such that the imprintable medium dispenser 22 may be appropriately located relative to an area of the substrate onto which imprintable medium is to be provided. As will be discussed in more detail below, the imprintable medium is provided in the form of drops. The imprintable medium dispenser 22 may be, or operate in a similar manner as, an inkjet printer, a bubble jet printer, or the like.

In one example, a plurality of areas (e.g. all areas) of the substrate may be provided with imprintable medium before an imprint template is imprinted into the imprintable medium provided on one or more areas of the substrate (either in series or parallel). However, due to the potential for the imprintable medium to evaporate before the imprint template has been imprinted into the imprintable medium, a more common approach is to provide an area of the substrate with imprintable medium immediately before the imprintable medium on that area is imprinted with the imprint template. This avoids or reduces any loss of the imprintable medium to evaporation.

Figure 2C:
FIG. 2c schematically depicts an imprint template to provide one or more patterns in the imprintable medium.

FIG. 2c shows an exemplary imprint template 2 that is used to imprint a pattern into imprintable medium provided on one or more areas of the substrate (for example, the imprint template shown in and described with reference to FIG. 1). An imprint template holder may be provided to hold and/or move the imprint template. The imprint template holder may be used to move the imprint template relative to the substrate (e.g. in a direction parallel to, and/or perpendicular to the substrate).

Figure 3A:
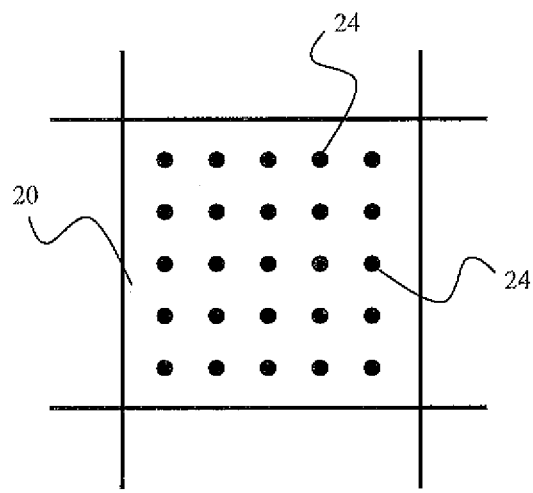
FIG. 3a schematically depicts an area of the substrate onto which a plurality of drops of imprintable medium has been provided.

FIG. 3a schematically depicts a plan view of an area 20 of the substrate. The imprintable medium dispenser described above has been used to provide a plurality of drops of imprintable medium 24 on to the area 20 of the substrate. A configuration (e.g. the number, location, separation, distribution, and/or position, and the like) of the drops of imprintable medium may be independent of the pattern to be imprinted into the imprintable medium by the imprint template. However, the configuration of the drops of imprintable medium may be dependent upon the pattern provided in the imprintable medium by the imprint template. For instance, the density or volume of drops in a certain sub-area of the area 20 of the substrate may be increased in comparison to other sub-areas if a pattern to be imprinted into the imprintable medium has a higher pattern density (or density of features) in that sub-area. Alternatively, the density or volume of drops in a certain sub-area of the area 20 of the substrate may be decreased in comparison to other sub-areas if a pattern to be imprinted into the imprintable medium has a lower pattern density (or density of features) in that sub-area. The configuration of the drops of imprintable medium may also be chosen to reduce or eliminate the possibility of imprintable medium flowing from one area of the substrate into another area of the substrate.

Figure 3B:
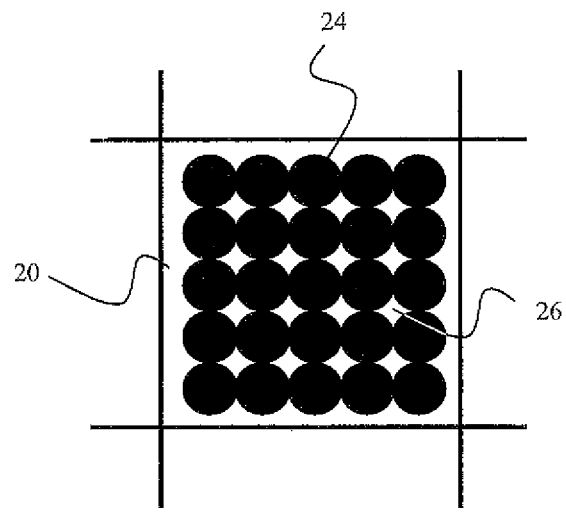
FIG. 3b schematically depicts the spreading of the drops of imprintable medium when an imprint template is pressed into the drops of imprintable medium.

Once the drops of imprintable medium have been provided on the substrate, the imprint template may come into contact with the drops of imprintable medium and pushed into the drops of imprintable medium (by appropriate movement of the imprint template and/or the substrate). FIG. 3b shows the drops of imprintable medium 24 when the imprint template has been pushed into the imprintable medium (imprint template is not shown in this Figure). Pushing the imprint template into the imprintable medium causes the drops of imprintable medium 24 to spread out. The drops of imprintable medium come into contact with one another and, at least to some extent, begin to coalesce. As discussed above, an imprint process may take place in a gaseous atmosphere.

Thus, as the drops of imprintable medium 24 come into contact with one another, pockets of gas 26 (e.g. pockets of helium gas) are trapped in-between the drops 24, the imprint template and the substrate. It is desirable to allow the pockets of gas 26 to diffuse such that the drops of imprintable medium are able to more freely extend around protrusions of the imprint template and into recesses of the imprint template, thus adopting the pattern features of the imprint template. In order for this to happen, time is needed to allow the pockets of gas 26 to diffuse, for example into the substrate and/or imprint template. During the diffusion of the gas, the concentration of the gas in the regions of the body into which the gas diffuses (e.g. the substrate and/or the imprint template) increases.

Figure 3C:
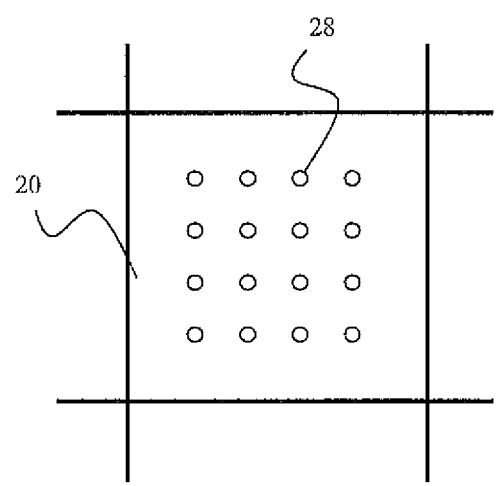
FIG. 3c schematically depicts the locations of pockets of gas trapped in-between the drops of imprintable medium, the imprint template (template not shown) and the substrate.

FIG. 3c schematically depicts the locations 28 of the pockets of gas relative to the area 20 of the substrate.

If during a subsequent imprint process the same configuration of drops of imprintable medium is used, the location of gas pockets relative to the imprint template will also be substantially the same. This means that the location of the gas pockets will substantially coincide with locations (e.g. regions) on the imprint template where there is already a concentration of (previously diffused) gas. For the subsequent imprint process, the presence of the gas in the imprint template will result in the rate of diffusion of the gas from the gas pockets into the imprint template being reduced. This results in an increase in the time taken for the gas to diffuse from the gas pockets and for the imprint process to be continued. This increases the overall time taken to implement the imprint process. This problem has not yet been identified in the prior art. It is desirable, for example, to reduce or eliminate this problem. The problem is particularly prevalent in an imprint template that is made from or comprises quartz, since such a template is commonly used in imprint lithography and certain gases are able to diffuse into such a template.

An additional or alternative problem is associated with gas pockets being located in the same location relative to the imprint template in one or more subsequent imprints. In imprint lithography, a release layer may be provided on the imprint template to reduce release forces that arise when releasing (e.g. removing) the imprint template from the imprintable medium. The release layer may be, for example, a perfluorotrichlorosilane self-assembled monolayer. However, this type of release layer suffers from high adhesion forces and low durability. Therefore, an alternative or additional solution to this problem is to add a surfactant to the imprint template and/or to the imprintable medium. A surfactant is a molecule with a polar part (liquidphilic, e.g., hydrophilic) and an apolar part (liquidphobic, e.g., hydrophobic). A surfactant having a hydrophilic polyether part —($CH_2$—$CH_2$—O$)_m$—H and a hydrophobic fluorinated part ($CF_2$—$CF_2)_n$—F may be used. Commercial names for this surfactant are Zonyl® FSO-100 from DuPont™ and FC-4432 from 3M™. The surfactant is added to the imprintable medium in a small quantity (<1%). The surfactant desirably settles at an interface between the imprintable medium and the environment (e.g. a gas such as air or helium) and/or between the imprintable medium and the imprint template.

During the release of the imprint template from the imprintable medium, the surfactant on the imprint template may wear. However, when the imprint template is next imprinted into the imprintable medium (e.g. in a subsequent imprint), surfactant from the imprintable medium is transferred to the template to replenish surfactant that was lost from the imprint template due to wear. During spreading of the imprintable medium, the surfactant is initially desirably present at the interface between the imprintable medium and the environment to lower the surface energy of the drop of imprintable medium. However, due to the speed at which the drop spreads, the concentration of surfactant at the interface between the imprintable medium and the environment becomes depleted (i.e. the 'front' of the droplet moves too quickly for the surfactant molecules to follow). Because of this, the region or area of the imprint template adjacent to the location of the gas pockets is not replenished with surfactant as well as other regions or areas of the imprint template. Since the total contact time between the imprint template and the imprintable medium is also shorter at the location of a gas pocket, this effect is enhanced. This means that defects as a result of release layer wear will likely occur at the place where the gas pockets were. If the substantially same configuration of drops of imprintable medium is used in subsequent imprints, this effect is even further enhanced, since the location of gas pockets, and thus lack of replenishment of surfactant, will be the same. This problem has not yet been identified in the prior art. It is desirable, for example, to reduce or eliminate this problem.

In some applications, surfactant depletion may be more of a problem than the reduction in the rate of diffusion of gas trapped in gas pockets.

According to an embodiment, one or more of the above mentioned problems may be obviated or mitigated by changing the configuration of the drops of imprintable medium in one or more successive or subsequent imprints. For example, by changing the configuration of the drops of imprintable medium for a subsequent imprint the location of one or more gas pockets will not correspond to the location of gas pockets formed in the previous imprint. By changing the configuration in this way, the gas in the gas pockets may diffuse more readily into, for example, the substrate and/or the imprint template since there will not be an increased concentration of gas in the location of the gas pocket that would otherwise function as a barrier to such diffusion. Alternatively or additionally, by changing the configuration of drops in this way, less wear may be incurred on the imprint template and/or the imprintable medium itself. This is because such wear will not be at the same location, since the gas pockets will be formed at different locations. For instance, by changing the configuration of drops in this way surfactant (if used) may more easily replenish areas of the imprint template, reducing wear to the imprint template (e.g. to a release layer of the imprint template).

For a subsequent imprint, it may be desirable to minimize or eliminate any overlap between the locations of one or more (e.g. a majority or all) gas pockets, thus further improving the diffusion of gas into the imprint template and/or substrate, and/or further reducing the wear to the imprint template.

Figure 4A:
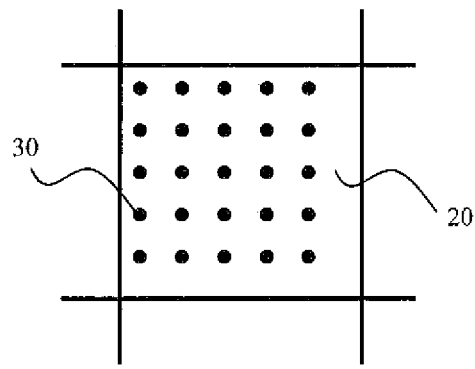
FIG. 4a schematically depicts an area of the substrate provided with drops of imprintable medium in a first configuration.

FIG. 4a schematically depicts an area 20 of the substrate. Drops of imprintable medium 30 have been provided on the area 20 of the substrate in a first configuration.

Figure 4B:
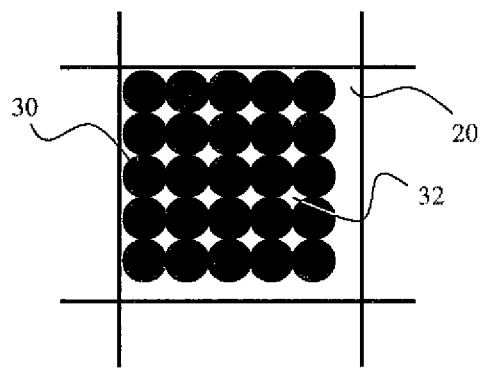
FIG. 4b schematically depicts the drops of imprintable medium in the first configuration when the imprint template has been pressed into the drops of imprintable medium.

FIG. 4b shows the drops of imprintable medium 30 when the imprint template has been pushed into the drops of imprintable medium 30. The drops 30 have spread out and come into contact with one another, trapping gas in gas pockets 32 between the drops 30, substrate and imprint template (as described above).

Figure 4C:
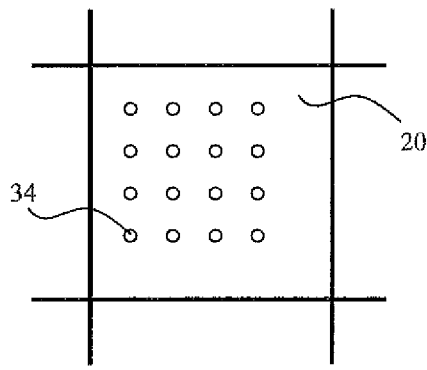
FIG. 4c schematically depicts the locations of gas pockets formed in-between the drops of imprintable medium in the first configuration, the imprint template (template not shown) and the substrate.

FIG. 4c schematically depicts the locations 34 of the gas pockets shown in and described with reference to FIG. 4b.

Figure 5A:
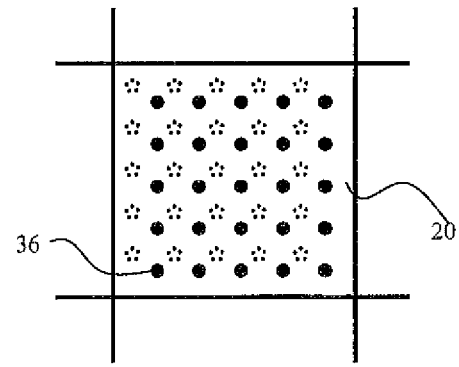
FIG. 5a schematically depicts an area of the substrate provided with drops of imprintable medium in a second configuration.
Figure 5B:
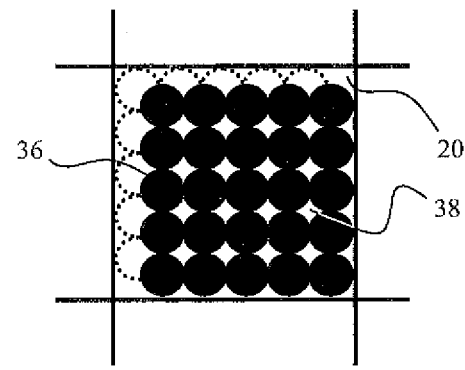
FIG. 5b schematically depicts the drops of imprintable medium in the second configuration when the imprint template has been pressed into the drops of imprintable medium.
Figure 5C:
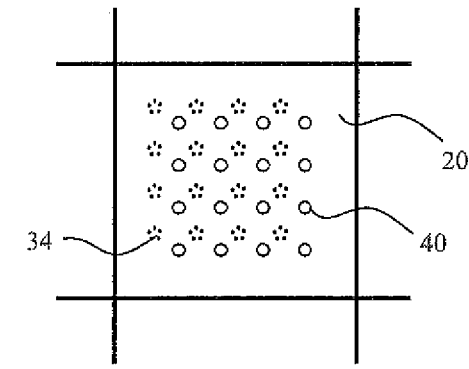
FIG. 5c schematically depicts the locations of gas pockets formed in-between the drops of imprintable medium in the second configuration, the imprint template (template not shown) and the substrate.

FIGS. 5a-5c show a subsequent imprint process on an area 20 of the substrate. The positions of drops of imprintable medium and locations of gas pockets in the subsequent imprint shown in FIGS. 5a to 5c are shown in solid black or in solid outline. For reference, the locations of the drops of imprintable medium and locations of gas pockets as shown in FIGS. 4a to 4c are shown in dashed outline in FIGS. 5a-5c. In the Figures, the positions of drops of imprintable medium and locations of gas pockets are shown relative to the area 20 of the substrate. However, it will be appreciated that the Figures are also representative of the positions of drops of imprintable medium and locations of gas pockets relative to the imprint template when the imprint template comes into contact with and is pressed into the drops of imprintable medium.

FIG. 5a shows that drops 36 of imprintable medium have been provided on the area 20 of the substrate in a second configuration. The patterns of the drops of the first and second configurations are substantially the same. However, the second configuration of the drops 36 is different from the first configuration of the drops shown in and described with reference to FIG. 4a. The difference is that in the second configuration, the pattern of drops has been shifted relative to the position of the drops in the first configuration. The pattern of drops has been shifted in a plane parallel to the surface of the substrate. The distribution, size, space in-between (i.e. pitch) and dimensions of the drops in the first and second configurations are substantially the same, although these properties can also be changed to bring about a change in the configuration of the drops as described in more detail below.

FIG. 5b shows the drops 36 of imprintable medium in the second configuration when the imprint template has come into contact with and pushed into the drops 36. The drops 36 have spread out and come into contact with one another forming gas pockets 38 in-between the drops 36, the template and the substrate. It can be seen in FIG. 5b that due to the drops 36 being in a second configuration, the drops 36 when spread out are also shifted in position relative to the drops in the first configuration. Because the drops 36 have been shifted relative to the drops in the first configuration, the location of gas pockets 38 relative to those in the first configuration have also shifted. FIG. 5c shows the location 40 of the gas pockets when the drops of the imprintable medium have been provided in a second configuration as shown in and described with reference to FIG. 5a. It can be seen that the locations 40 of the gas pockets for the drops in the second configuration are offset and separated from the locations 34 of the gas pockets for the drops when in the first configuration shown in and described with reference to FIG. 4a. This also means that the locations 40 of the gas pockets relative to the imprint template for the drops in the second configuration are offset and separated from the locations 34 of the gas pockets relative to the imprint template for the drops when in the first configuration shown in and described with reference to FIG. 4a.

By changing the configuration of the drops of imprintable medium as shown in and described with reference to FIGS. 4a to 4c and 5a to 5c, there is substantially no overlap between the locations of gas pockets relative to the imprint template for two subsequent imprints (e.g. on different areas of the substrate, or, although less common, on the same area of the substrate). Diffusion of the gas from the gas pockets into the imprint template is increased and the wear to the imprint template due to, for instance, a reduction in the concentration of surfactant, is also reduced.

FIGS. 4a to 4c and 5a to 5c show the imprint of a pattern into a layer of imprintable medium provided on areas (e.g. different areas or the same area) of the substrate. Usually, a step and repeat imprint lithography process will be undertaken where the imprint template is imprinted into drops of imprintable medium provided on different areas of the substrate. In practice, it is thus more likely that subsequent imprints will be undertaken on different areas of the substrate, and not the same area of the substrate. By changing the configuration of drops of imprintable medium provided on the different areas in a manner similar to that shown in FIGS. 4a to 4c and 5a to 5c (but to different areas of the substrate), there is no overlap between the locations of gas pockets in-between two imprints relative to the imprint template (and substrate). Diffusion of the gas from the gas pockets is increased and the wear to the imprint template due to, for instance, a reduction in the concentration of surfactant, is also reduced.

Figure 6A:
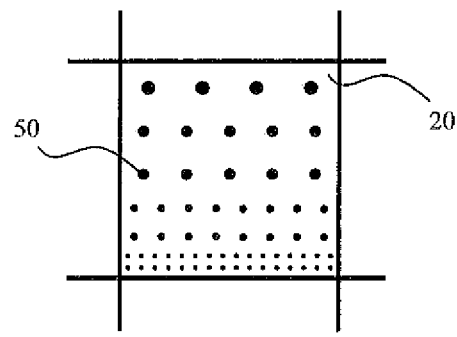
FIG. 6a schematically depicts an area of the substrate onto which a plurality of drops of imprintable medium has been provided, the drops having different sizes.
Figure 6B:
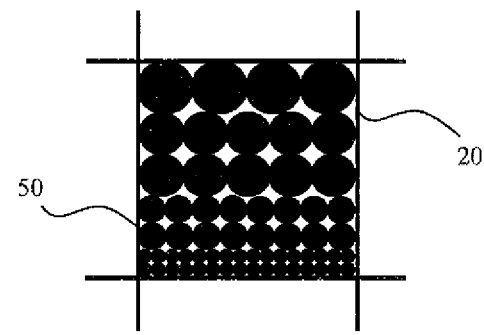
FIG. 6b schematically depicts the drops of imprintable medium shown in and described with reference to FIG. 6a when an imprint template has been pressed into the drops of imprintable medium.
Figure 7A:
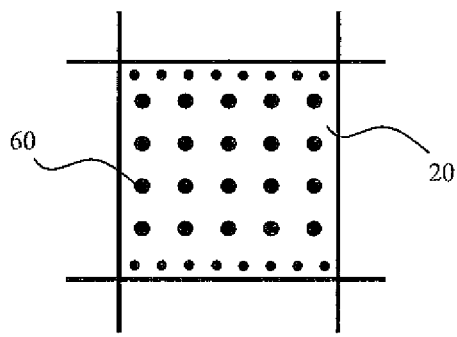
FIG. 7a schematically depicts an area of the substrate onto which a plurality of drops of imprintable medium has been provided, the drops having different sizes.
Figure 7B:
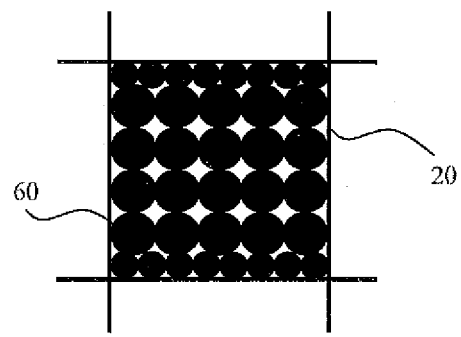
FIG. 7b schematically depicts the drops of imprintable medium shown in and described with reference to FIG. 7a when an imprint template has been pressed into the drops of imprintable medium.

FIGS. 4a to 4c and 5a to 5c show that the configuration of drops of imprintable medium may be changed for a subsequent imprint by shifting the position of the entire pattern of drops. Other changes to the configuration are possible to bring about changes in the locations of one or more gas pockets relative to the imprint template and/or the substrate. For example, FIG. 6a shows that, in comparison with the configuration of drops shown in and described with reference to FIG. 3a, the number and/or density and/or size (e.g. volume) of the drops 50 may be changed. FIG. 6b shows that when the imprint template comes into contact with and pressed into the drops when in the configuration shown in and described with reference to FIG. 6a, the drops 50 still fill the area 20 of the substrate as desired. FIG. 7a shows another configuration of drops 60 where the number and/or density and/or size (e.g. volume) of the drops has been varied. FIG. 7b shows the corresponding configuration of drops when the imprint template comes into contact with and pressed into the drops of imprintable medium.

Figure 8:
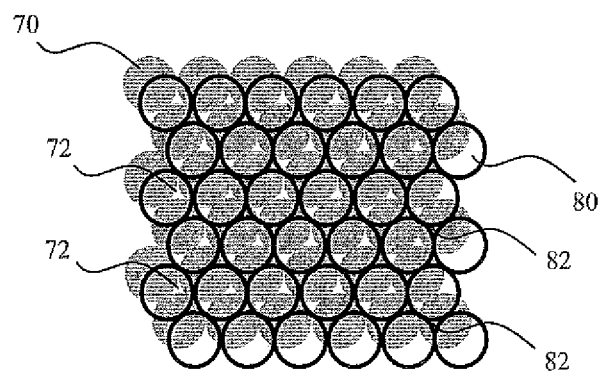
FIG. 8 schematically depicts the location of drops of an imprintable medium in a first configuration when an imprint template has been pressed into the drops of imprintable medium, and the location of drops of an imprintable medium in a second configuration when an imprint template has been pressed into the drops of imprintable medium, the locations being shown overlaid on top of one another.

FIG. 8 shows that, in one (e.g. of possibly many) ideal example a first configuration 70 of imprintable medium drops and a second configuration 80 of imprintable medium drops are different (e.g. shifted) such that none of the gas pocket locations overlap in a subsequent imprint.

FIG. 8 schematically depicts the location of drops 70 of an imprintable medium in a first configuration when an imprint template has been pressed into the drops of imprintable medium, and the location of drops 80 of an imprintable medium in a second configuration when an imprint template has been pressed into the drops of imprintable medium, the locations being shown overlaid on top of one another. The first and second configurations are one of many examples, wherein the locations of gas pockets 72 in the first configuration do not overlap with any of the gas pockets 82 in the second configuration. Other configurations may be used in which the locations of gas pockets in the first configuration do not overlap with any of the gas pockets in the second configuration.

The exact nature of the configuration of drops of imprintable medium and changes in that configuration that reduce or eliminate the overlap in the locations of subsequent gas pockets relative to the imprint template may vary for different patterns, for different gases, for different imprintable medium viscosities, as well as other variables. Suitable configurations may be determined from, amongst other things, trial and error, experimentation and/or modeling.

When determining the different configurations, the volume of the drops of imprintable medium should be taken into account. For instance, the volume of the drop or groups of adjacent drops may correspond to the local pattern density of the imprint template that is to be pushed into the imprintable medium at that location. Even when varying the configurations, the total amount of imprintable medium in an area of the substrate may remain constant to help ensure that there is no variation in the coverage of the imprintable medium or, for example, the thickness of the pattern(s) or pattern feature(s) provided when different configurations of drops of imprintable medium are used. Furthermore, when varying the size (e.g. volume) of the drops to change the configuration, if the drops are too small they may evaporate too quickly, and this is disadvantageous. Alternatively, if the drops are too big it may take longer for the larger drops to spread in and around protrusions and recesses provided in the imprint template thus increasing the imprint process time. Therefore, a suitable volume for the drops of imprintable medium may be 1-20 pl, drops of such size not evaporating too quickly, or taking too long a time to spread in and around protrusions and recesses provided in the imprint template. A larger range for the droplet volume that might also be suitable is 1 pl to 100 pl.

As discussed above, it is desirable to vary the location of gas pockets relative to the imprint template to increase the diffusion rate of gas from those pockets on a subsequent imprint; and/or to reduce the wear and/or damage on (e.g.) a release layer of the imprint template in a subsequent imprint (which is caused by surfactant depletion). With regard to diffusion, this problem may be overcome by using different imprint templates, since different imprint templates will not have a residual amount or concentration of gas located within them. Therefore, an embodiment of the present invention provides an alternative solution, since it facilitates the use of the same imprint template, thus increasing process speed. An embodiment of the invention is thus particularly applicable to imprint processes in which the same imprint template is used in a subsequent imprint. After, for example, a certain number of imprints, the concentration of gas within the imprint template may be sufficiently low to allow the configuration of the drops of imprintable medium to return to the original configuration without having any effect (or much of any effect) on the diffusion of gas into the template, and/or on the wear to the imprint template. Similarly or alternatively, after, for example, a certain number of imprints, the surfactant on the imprint template may be sufficiently replenished to allow the configuration of the drops of imprintable medium to return to the original configuration without encountering the problem of surfactant depletion discussed above.

In the above mentioned embodiments, a single imprint template has been described as coming into contact with and pushed into the drops imprintable medium to form a pattern in that imprintable medium. In a further example, a plurality of imprint templates may be brought into contact with and pressed into imprintable medium provided on one or more areas of the substrate, either in series or in parallel and/or substantially simultaneously. When the imprint templates are brought into contact with the imprintable medium in parallel (e.g. simultaneously), movement of individual imprint templates can be synchronized, or alternatively the different imprint templates may be attached to a common support to allow such parallel imprinting. Alternatively or additionally, a single imprint template may be provided and which is arranged to imprint a plurality of areas of a substrate each time the template comes into contact with imprintable medium provided on the substrate.

More than one area of a substrate may be provided with drops of imprintable medium before, for example, a pattern is imprinted into imprintable medium on those areas in a step and repeat process. Each different area may be provided with drops having a different configuration to achieve an advantage discussed herein. If parallel imprints are undertaken, the configuration of drops of imprintable medium for each of the parallel imprints may be the same. The configuration of drops of imprintable medium may then be changed for the subsequent parallel imprint to help ensure that gas pockets are formed at different locations relative to the imprint templates during the subsequent parallel imprint.

The pockets of gas may alternatively or additionally be referred to as inclusions, defects, enclosures, bubbles, the place of gas enclosure, or the position or region of the center of gravity of the gas bubble or inclusion. In some cases, for example where no gas is used in the imprint process (e.g. the process is undertaken in an evacuated environment), the pockets may contain very little or no gas.

The imprint methods discussed herein may be implemented in an imprint lithography apparatus. The apparatus may comprise a substrate holder to hold a substrate, an imprintable medium dispenser to dispense drops of imprintable medium onto the substrate, a control arrangement to control one or both of the substrate holder and the imprintable medium dispenser to ensure that drops of imprintable medium are provided on a surface of the substrate in a specific configuration, and an imprint template to imprint a pattern into the imprintable medium. An imprint template holder may be provided to hold and/or move the imprint template. For a first imprint, the control arrangement may be configured to ensure that a plurality of drops of imprintable medium are provided on an area of the substrate, the plurality of drops of imprintable medium having a first configuration. This may be achieved by, for example, appropriate movement of the substrate (or substrate holder) and/or imprintable medium dispenser, and/or by controlling the output of the imprintable medium dispenser (e.g. drop distribution, drop size, and the like). For a second, subsequent, imprint, the control arrangement may be configured to ensure that a plurality of drops of imprintable medium are provided on an area of the substrate, the plurality of drops of imprintable medium having a second configuration. This may be achieved by, for example, appropriate movement of the substrate (or substrate holder) and/or imprintable medium dispenser, and/or by controlling the output of the imprintable medium dispenser (e.g. drop distribution, drop size, and the like). The control arrangement may be configured to ensure that the first configuration is different from the second configuration, such that pockets formed between the imprint template, drops of imprintable medium and the substrate during the second imprint are formed at different locations relative to the imprint template to pockets formed between the imprint template, the drops of imprintable medium and the substrate during the first imprint. The areas of the substrate for the first and second imprint may be the same (i.e. the second imprint is undertaken on top of the first imprint) or the areas of the substrate for the first and second imprint may be different (e.g. the imprints may take place at different locations on the substrate).

One or more imprintable medium dispensers may be provided. One or more imprint templates and/or imprint template holders may be provided. The control arrangement could be, for example, any suitable arrangement. For example, the control arrangement could be, for example a processor, an embedded processor, or a computer.

It will be appreciated from the above description that the first configuration of drops of imprintable medium is different from the second configuration of drops of imprintable medium. The first and second configurations are intentionally different, i.e. there is an intention when imprinting to ensure that the first configuration of drops of imprintable medium is different from the second configuration of drops of imprintable medium. It will be appreciated that when repeatedly providing the same configuration of drops, as is the case in the prior art, different repetitions may unintentionally provide different drop configurations. For example, the blockage of nozzles of an imprintable medium dispenser may lead to an anomaly in a configuration of drops that is provided which would lead to one configuration of drops being unintentionally different from another configuration of drops. For clarity, and in order to distinguish an embodiment of the present invention from the prior art, it may be said that the method of an embodiment of the present invention comprises controlling an imprintable medium dispenser with first control instructions (e.g. via a controller of the imprintable medium dispenser) to provide the drops in the first configuration, and controlling an imprintable medium dispenser with second control instructions (e.g. via a controller of the imprintable medium dispenser) to provide the drops in the second configuration, the first and second control instructions being different. The provision of different instructions to provide the different configurations clearly distinguishes from an unintentional change in the configuration of drops.

In the above mentioned embodiments, multiple imprints have been shown as taking place on a single substrate. Instead, a plurality of imprints may be undertaken on a plurality of substrates. For instance, a first imprint may be undertaken on an area of a first substrate. A second imprint may be undertaken on a second substrate. A first configuration of drops of imprintable medium for the first imprint may be different from a second configuration of drops of imprintable medium for the second imprint, such that pockets formed during the second imprint are formed at different locations relative to the imprint template to pockets formed during the first imprint.

The imprint methods discussed above have shown or at least implied that the imprint template is imprinted into the imprintable medium in such a way that the imprint template remains substantially parallel to the substrate. In an example, the imprint template is imprinted into the imprintable medium in such a way that the imprint template is not parallel to the substrate when the imprint template initially comes into contact with the substrate, but instead lies at an angle to the substrate. After this, the imprint template is allowed (e.g. moved) to adopt an orientation that is parallel to the imprint template so that the imprint template may imprint a pattern into imprintable medium on the substrate. This is known as imprinting under an angle. Imprinting under an angle may be used to increase the flow of gas from between the imprint template and the substrate during an imprint, making the imprint process quicker.

An embodiment of the present invention is applicable to an imprint method in which the imprintable medium is provided in the form of drops (and not, for example, provided by spin coating onto the substrate). Radiation other than UV may be used to 'freeze' the imprint pattern. Radiation may not be required, and the pattern may be fixed by heating or cooling.

An embodiment of the present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, etc. The devices may have feature or pattern sizes of the order of nanometers. Pattern features of an imprint template used to provide or fabricate these device features may also have sizes or dimensions of the order of nanometers.

In this specification, the term "substrate" is meant to include any surface layer forming part of the substrate, or being provided on another substrate, such as a planarization layer, or an anti-reflection coating layer, or a previously applied patterned or unpatterned imprintable medium layer.

The described and illustrated embodiments are to be considered as illustrative and not restrictive in character, it being understood that only certain embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Aspects of the invention are set out as in the following numbered clauses:

1. An imprint lithography method comprising:
undertaking a first imprint, which comprises:
for an area of a substrate provided with a plurality of drops of imprintable medium in a first configuration, imprinting a pattern in the imprintable medium using an imprint template, pockets being formed between the drops of the imprintable medium, the imprint template and the substrate during the imprinting of the pattern; and
undertaking a second imprint, which comprises:
for an area of a substrate provided with a plurality of drops of imprintable medium in a second configuration, imprinting a pattern in the imprintable medium using the same imprint template, pockets being formed between the drops of the imprintable medium, the imprint template and the substrate during the imprinting of the pattern;
wherein the first configuration of drops of imprintable medium is different from the second configuration of drops of imprintable medium, such that pockets formed during the second imprint are formed at different locations relative to the imprint template to pockets formed during the first imprint.

2. The method of clause 1, comprising, before the respective imprinting a pattern in the imprintable medium, controlling an imprintable medium dispenser with first control instructions to provide the drops in the first configuration, and controlling an imprintable medium dispenser with second control instructions to provide the drops in the second configuration, the first and second control instructions being different.

3. The method of any preceding clause, wherein the first configuration is different from the second configuration, such that a majority of pockets formed during the second imprint are formed at different locations relative to the imprint template to pockets formed during the first imprint.

4. The method of any preceding clause, wherein the first configuration is different from the second configuration, such that all pockets formed during the second imprint are formed at different locations relative to the imprint template to pockets formed during the first imprint.

5. The method of any preceding clause, further comprising undertaking a further imprint, the configuration of the drops of imprintable medium being changed for the further imprint such that pockets formed during the further imprint are formed at different locations relative to the imprint template to pockets formed during a previous imprint.

6. The method of clause 5, further comprising, after undertaking the first, second and further imprints, undertaking an additional imprint where the drops of imprintable medium have the substantially same configuration as was used in the first imprint.

7. The method of any preceding clause, wherein for the first and/or second imprint, the imprint template is imprinted into the imprintable medium in such a way that the imprint template is not parallel to the substrate when the imprint template initially comes into contact with the substrate, but instead lies at an angle to the substrate.

8. The method of any preceding clause, wherein the second configuration of drops of imprintable medium has the substantially same pattern as the first configuration of drops of imprintable medium, the second configuration being different from the first configuration in that the pattern is shifted in a plane substantially parallel to the surface of the substrate.

9. The method of any preceding clause, wherein the second configuration of drops of imprintable medium is different from the first configuration of drops of imprintable medium in that one or more drops of the second configuration have a different position, size or volume in comparison with one or more drops of the first configuration.

10. The method of any preceding clause, wherein the second configuration of drops of imprintable medium is different from the first configuration of drops of imprintable medium in that the second configuration has a different pattern in comparison with the first configuration.

11. The method of any preceding clause, wherein the second configuration of drops of imprintable medium is different from the first configuration of drops of imprintable medium in that the second configuration comprises greater or fewer drops in comparison with the first configuration.

12. The method of any preceding clause, wherein the total volume of all drops of imprintable medium is substantially equal for the first configuration and the second configuration.

13. The method of any preceding clause, wherein the volume of each drop of imprintable medium is in the range of 1 pl to 100 pl, or 1 pl to 20 pl.

14. The method of any preceding clause, undertaken in a gaseous atmosphere, such that the pockets contain or comprise gas.

15. The method of clause 14, wherein the gaseous atmosphere comprises helium, such that the pockets contain or comprise helium.

16. The method of any preceding clause, wherein the imprint template has a release layer.

17. The method of any preceding clause, wherein a surfactant is on the imprint template, and/or in or on the imprintable medium.

18. The method of any preceding clause, wherein the first and second imprints are undertaken in parallel and/or substantially simultaneously.

19. The method of any preceding clause, further comprising:
providing the plurality of drops of imprintable medium in the first configuration on an area of the substrate before the first and/or second imprint is undertaken, and/or
providing the plurality of drops of imprintable medium in the second configuration on an area of the substrate before the first and/or second imprint is undertaken.

20. The method of any preceding clause, wherein the imprint template is made from or comprises quartz.

21. An imprint lithography apparatus comprising:
a substrate holder to hold a substrate;
an imprintable medium dispenser to dispense drops of imprintable medium onto the substrate;
a control arrangement to control one or both of the substrate holder and the imprintable medium dispenser to ensure that drops of imprintable medium are provided on a surface of the substrate in a specific configuration; and
an imprint template holder configured to hold an imprint template to imprint a pattern into the imprintable medium,
wherein
for a first imprint, the control arrangement is configured to ensure that a plurality of drops of imprintable medium are provided on an area of the substrate, the plurality of drops of imprintable medium having a first configuration, and
for a second imprint, the control arrangement is configured to ensure that a plurality of drops of imprintable medium are provided on an area of the substrate, the plurality of drops of imprintable medium having a second configuration, and
the control arrangement is configured to ensure that the first configuration of drops of imprintable medium is different from the second configuration of drops of imprintable medium, such that pockets formed between the imprint template, the drops of imprintable medium and the substrate during the second imprint are formed at different locations relative to the imprint template to pockets formed between the imprint template and the drops of imprintable medium during the first imprint.

22. An imprint lithography method comprising:
controlling an imprintable medium dispenser with first control instructions to provide a plurality of drops of imprintable medium in a first configuration;
undertaking a first imprint, which comprises:
for an area of a substrate provided with the drops in the first configuration, imprinting a pattern in the imprintable medium using an imprint template, pockets being formed between the drops of the imprintable medium, the imprint template and the substrate during the imprinting of the pattern;
controlling an imprintable medium dispenser with second control instructions to provide a plurality of drops of imprintable medium in a second configuration, the first and second control instructions being different; and
undertaking a second imprint, which comprises:
for an area of a substrate provided with the drops in the second configuration, imprinting a pattern in the imprintable medium using the same imprint template, pockets being formed between the drops of the imprintable medium, the imprint template and the substrate during the imprinting of the pattern,
wherein the first configuration of drops of imprintable medium is different from the second configuration of drops of imprintable medium, such that pockets formed during the second imprint are formed at different locations relative to the imprint template to pockets formed during the first imprint.

23. An imprint lithography apparatus comprising:
a substrate holder to hold a substrate;
an imprintable medium dispenser to dispense drops of imprintable medium onto the substrate;
a control arrangement to control one or both of the substrate holder and the imprintable medium dispenser to ensure that drops of imprintable medium are provided on a surface of the substrate in a specific configuration; and
an imprint template holder configured to hold an imprint template to imprint a pattern into the imprintable medium,
wherein
for a first imprint, the control arrangement is configured to provide to the imprint medium dispenser, or be arranged to receive, first instructions that are configured to ensure that a plurality of drops of imprintable medium are provided on an area of the substrate, the plurality of drops of imprintable medium having a first configuration; and
for a second imprint, the control arrangement is configured to provide to the imprint medium dispenser, or be arranged to receive, second instructions that are configured to ensure that a plurality of drops of imprintable medium are provided on an area of the substrate, the plurality of drops of imprintable medium having a second configuration, wherein the instructions and/or the control arrangement is configured to ensure that the first configuration of drops of imprintable medium is different from the second configuration of drops of imprintable medium, such that pockets formed between the imprint template, the drops of imprintable medium and the substrate during the second imprint are formed at different locations relative to the imprint template to pockets formed between the imprint template, the drops of imprintable medium and the substrate during the first imprint.

24. An imprint lithography method comprising:
undertaking a first imprint, which comprises:
for an area of a substrate provided with a plurality of drops of imprintable medium in a first configuration, imprinting a pattern in the imprintable medium using an imprint template; and
undertaking a second imprint, which comprises:
for an area of a substrate provided with a plurality of drops of imprintable medium in a second configuration, imprinting a pattern in the imprintable medium using the same imprint template,
wherein the first configuration of drops of imprintable medium is different from the second configuration of drops of imprintable medium.

25. An imprint lithography apparatus comprising:
a substrate holder to hold a substrate;
an imprintable medium dispenser to dispense drops of imprintable medium onto the substrate;
a control arrangement to control one or both of the substrate holder and the imprintable medium dispenser to ensure that drops of imprintable medium are provided on a surface of the substrate in a specific configuration; and
an imprint template holder configured to hold an imprint template to imprint a pattern into the imprintable medium,
wherein
for a first imprint, the control arrangement is configured to ensure that a plurality of drops of imprintable medium are provided on an area of the substrate, the plurality of drops of imprintable medium having a first configuration, and
for a second imprint, the control arrangement is configured to ensure that a plurality of drops of imprintable medium are provided on an area of the substrate, the plurality of drops of imprintable medium having a second configuration, and
the control arrangement is configured to ensure that the first configuration of drops of imprintable medium is different from the second configuration of drops of imprintable medium.

26. An imprint lithography method comprising:
controlling an imprintable medium dispenser with first control instructions to provide a plurality of drops of imprintable medium in a first configuration;
undertaking a first imprint, which comprises:
for an area of a substrate provided with the drops in the first configuration, imprinting a pattern in the imprintable medium using an imprint template;
controlling an imprintable medium dispenser with second control instructions to provide a plurality of drops of imprintable medium in a second configuration, the first and second control instructions being different; and
undertaking a second imprint, which comprises:
for an area of a substrate provided with the drops in the second configuration, imprinting a pattern in the imprintable medium using the same imprint template,
wherein the first configuration of drops of imprintable medium is different from the second configuration of drops of imprintable medium.

27. An imprint lithography apparatus comprising:
a substrate holder to hold a substrate;
an imprintable medium dispenser to dispense drops of imprintable medium onto the substrate;
a control arrangement to control one or both of the substrate holder and the imprintable medium dispenser to ensure that drops of imprintable medium are provided on a surface of the substrate in a specific configuration; and
an imprint template holder configured to hold an imprint template to imprint a pattern into the imprintable medium,
wherein
for a first imprint, the control arrangement is configured to provide to the imprintable medium dispenser, or be arranged to receive, first instructions that are configured to ensure that a plurality of drops of imprintable medium are provided on an area of the substrate, the plurality of drops of imprintable medium having a first configuration,
for a second imprint, the control arrangement is configured to provide to the imprintable medium dispenser, or be arranged to receive, second instructions that are configured to ensure that a plurality of drops of imprintable medium are provided on an area of the substrate, the plurality of drops of imprintable medium having a second configuration, and
the instructions and/or the control arrangement is configured to ensure that the first configuration of drops of imprintable medium is different from the second configuration of drops of imprintable medium.

28. An imprint method comprising:
forming a first pattern of imprintable medium on a substrate and a second pattern of imprintable medium on a substrate, the first and second patterns being different; and
imprinting the first and second patterns with the same template.

29. An imprint method comprising:
instructing an imprintable medium dispenser to form a first pattern of imprintable medium on a substrate and a second pattern of imprintable medium on a substrate, wherein instructions to the imprintable medium dispenser to form the first pattern and the second pattern are different; and
imprinting the first and second patterns with the same template.

The invention claimed is:
1. An imprint lithography method comprising:
undertaking a first imprint, which comprises:
for an area of a substrate provided with a plurality of drops of imprintable medium in a first configuration, imprinting a pattern in the imprintable medium using an imprint template, pockets being formed between the drops of the imprintable medium, the imprint template and the substrate during the imprinting of the pattern; and
undertaking a second imprint, which comprises:
for an area of a substrate provided with a plurality of drops of imprintable medium in a second configuration, imprinting a pattern in the imprintable medium using the same imprint template, pockets being formed between the drops of the imprintable medium, the imprint template and the substrate during the imprinting of the pattern;
wherein the second configuration of drops of imprintable medium has the substantially same pattern as the first configuration of drops of imprintable medium and one or more drops of the second configuration have a different size or volume in comparison with corresponding one or more drops of the first configuration, such that pockets formed during the second imprint are formed at different locations relative to the imprint template to pockets formed during the first imprint, and wherein the first and second imprints are undertaken on different non-overlapping areas on the substrate of a same layer on the substrate.

2. The method of claim 1, comprising, before the respective imprinting a pattern in the imprintable medium, controlling an imprintable medium dispenser with first control instructions to provide the drops in the first configuration, and controlling an imprintable medium dispenser with second control instructions to provide the drops in the second configuration, the first and second control instructions being different.

3. The method of claim 1, wherein a majority of pockets formed during the second imprint are formed at different locations relative to the imprint template to pockets formed during the first imprint.

4. The method of claim 1, wherein all pockets formed during the second imprint are formed at different locations relative to the imprint template to pockets formed during the first imprint.

5. The method of claim 1, further comprising undertaking a further imprint, the configuration of the drops of imprintable medium being changed for the further imprint such that pockets formed during the further imprint are formed at different locations relative to the imprint template to pockets formed during a previous imprint.

6. The method of claim 5, further comprising, after undertaking the first, second and further imprints, undertaking an additional imprint where the drops of imprintable medium have the substantially same configuration as was used in the first imprint.

7. The method of claim 1, wherein for the first and/or second imprint, the imprint template is imprinted into the imprintable medium in such a way that the imprint template is not parallel to the substrate when the imprint template initially comes into contact with the substrate, but instead lies at an angle to the substrate.

8. The method of claim 1, wherein the pattern of drops is shifted in a plane substantially parallel to the surface of the substrate for the second configuration with respect to the first configuration.

9. The method of claim 1, wherein the total volume of all drops of imprintable medium is substantially equal for the first configuration and the second configuration.

10. The method of claim 1, wherein the volume of each drop of imprintable medium is in the range of 1 pl to 100 pl.

11. The method of claim 1, undertaken in a gaseous atmosphere, such that the pockets contain or comprise gas.

12. The method of claim 11, wherein the gaseous atmosphere comprises helium, such that the pockets contain or comprise helium.

13. The method of claim 1, wherein the imprint template has a release layer.

14. The method of claim 1, wherein a surfactant is on the imprint template, and/or in or on the imprintable medium.

15. The method of claim 1, wherein the first and second imprints are undertaken in parallel and/or substantially simultaneously.

16. The method of claim 1, further comprising providing the plurality of drops of imprintable medium in the first configuration on an area of the substrate before the first and/or second imprint is undertaken, and/or providing the plurality of drops of imprintable medium in the second configuration on an area of the substrate before the first and/or second imprint is undertaken.

17. The method of claim 1, wherein the imprint template is made from or comprises quartz.

18. An imprint lithography method comprising:
    undertaking a first imprint, which comprises:
        for an area of a substrate provided with a plurality of drops of imprintable medium in a first configuration, imprinting a pattern in the imprintable medium using an imprint template, pockets being formed between the drops of the imprintable medium, the imprint template and the substrate during the imprinting of the pattern; and
    undertaking a second imprint, which comprises:
        for an area of a substrate provided with a plurality of drops of imprintable medium in a second configuration, imprinting a pattern in the imprintable medium using the same imprint template, pockets being formed between the drops of the imprintable medium, the imprint template and the substrate during the imprinting of the pattern;
    wherein the second configuration has a different pattern in comparison with the first configuration, such that pockets formed during the second imprint are formed at different locations relative to the imprint template to pockets formed during the first imprint, and
    wherein the first and second imprints are undertaken on different non-overlapping areas on the substrate of a same layer on the substrate.

19. The method of claim 18, wherein all pockets formed during the second imprint are formed at different locations relative to the imprint template to pockets formed during the first imprint.

20. An imprint lithography method comprising:
    undertaking a first imprint, which comprises:
        for an area of a substrate provided with a plurality of drops of imprintable medium in a first configuration, imprinting a pattern in the imprintable medium using an imprint template, pockets being formed between the drops of the imprintable medium, the imprint template and the substrate during the imprinting of the pattern; and
    undertaking a second imprint, which comprises:
        for an area of a substrate provided with a plurality of drops of imprintable medium in a second configuration, imprinting a pattern in the imprintable medium using the same imprint template, pockets being formed between the drops of the imprintable medium, the imprint template and the substrate during the imprinting of the pattern;
    wherein the second configuration comprises greater or fewer drops in comparison with the first configuration, such that pockets formed during the second imprint are formed at different locations relative to the imprint template to pockets formed during the first imprint, and
    wherein the first and second imprints are undertaken on different non-overlapping areas on the substrate of a same layer on the substrate.

* * * * *